United States Patent
Kennon et al.

(10) Patent No.: US 6,941,255 B2
(45) Date of Patent: Sep. 6, 2005

(54) FEATURE MODELING IN A FINITE ELEMENT MODEL

(75) Inventors: Stephen R. Kennon, Austin, TX (US); Steven B. Ward, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 842 days.

(21) Appl. No.: 09/896,132

(22) Filed: Jun. 29, 2001

(65) Prior Publication Data

US 2002/0032494 A1 Mar. 14, 2002

Related U.S. Application Data

(60) Provisional application No. 60/215,697, filed on Jun. 29, 2000.

(51) Int. Cl.[7] .............................. G06F 7/48; G06F 17/10
(52) U.S. Cl. ............................... 703/10; 703/2; 345/419
(58) Field of Search ........................ 703/2, 10; 702/6; 345/419, 420

(56) References Cited

U.S. PATENT DOCUMENTS

| | | | |
|---|---|---|---|
| 3,029,018 A | 4/1962 | Floyd, Jr. | 703/9 |
| 3,302,710 A | 2/1967 | Odeh | 166/269 |
| 4,821,164 A | 4/1989 | Swanson | 702/5 |
| 5,255,212 A | 10/1993 | Kondoh et al. | 703/9 |
| 5,432,718 A | 7/1995 | Molvig et al. | 703/9 |
| 5,553,009 A | 9/1996 | Meshkat et al. | 716/20 |
| 5,572,634 A | 11/1996 | Duluk, Jr. | 345/419 |
| 5,604,911 A | 2/1997 | Ushiro | 703/2 |
| 5,617,322 A | 4/1997 | Yokota | 700/98 |
| 5,675,521 A | 10/1997 | Holzhauer et al. | 716/20 |
| 5,699,271 A | 12/1997 | Sagawa et al. | 716/20 |
| 5,710,726 A | 1/1998 | Rowney et al. | 703/10 |

(Continued)

FOREIGN PATENT DOCUMENTS

| | | | |
|---|---|---|---|
| EP | 0 709 789 A2 | 5/1996 | |
| EP | 0 801 364 B1 | 7/2003 | |
| FR | 2775094 | 8/1999 | |
| GB | 2326747 A | 12/1998 | |
| WO | WO 99/40532 | 8/1999 | |
| WO | WO 99/52048 | 10/1999 | |
| WO | WO 99/57418 | 11/1999 | E21B/49/00 |
| WO | WO 02/01251 A2 | 1/2002 | |
| WO | WO 02/02901 A2 | 1/2002 | |
| WO | WO 02/03101 A2 | 1/2002 | |
| WO | WO 02/03103 A2 | 1/2002 | |
| WO | WO 02/03262 A2 | 1/2002 | |
| WO | WO 02/03263 A2 | 1/2002 | |
| WO | WO 02/03264 A2 | 1/2002 | |
| WO | WO 02/03265 A2 | 1/2002 | |

OTHER PUBLICATIONS

Forsyth, Local Mesh Refinement and Modeling of Faults and Pinchouts, SPE Form Eval, Jun. 1986, vol. 1, No. 3, pp. 275–285.*

(Continued)

*Primary Examiner*—Russell Frejd
(74) *Attorney, Agent, or Firm*—Toler, Larson & Abel, LLP

(57) ABSTRACT

A method for simulating a physical system using finite element techniques, wherein two or more distinct models corresponding to distinct regions within the modeled system are solved, each with a corresponding evaluator. Nodes which lie on the boundaries between the models may have different values corresponding to the different models. When a particular model is solved, the evaluator for that model is used to obtain the appropriate values for each of these common nodes. In one embodiment, a first model is defined, then a region corresponding to a particular feature within the system is carved out of it. A finite element model corresponding to the feature is then inserted into the region. The finite elements may be adapted to share nodes on the boundaries between them.

20 Claims, 8 Drawing Sheets

U.S. PATENT DOCUMENTS

| | | | |
|---|---|---|---|
| 5,740,342 A | 4/1998 | Kocberber | 395/120 |
| 5,754,181 A | 5/1998 | Amdursky et al. | 345/419 |
| 5,891,131 A | 4/1999 | Rajan et al. | 606/5 |
| 5,966,524 A | 10/1999 | Burnett et al. | 703/5 |
| 5,999,187 A | 12/1999 | Dehmlow et al. | 345/420 |
| 6,014,473 A | 1/2000 | Hossack et al. | 382/294 |
| 6,018,497 A | 1/2000 | Gunasekera | 367/72 |
| 6,028,607 A | 2/2000 | Chan | 345/419 |
| 6,041,017 A | 3/2000 | Goldsberry | 367/38 |
| 6,052,520 A | 4/2000 | Watts, III | 703/10 |
| 6,054,992 A | 4/2000 | Gibson | 345/424 |
| 6,064,810 A | 5/2000 | Raad et al. | 703/23 |
| 6,070,125 A | 5/2000 | Murphy et al. | 702/11 |
| 6,078,869 A * | 6/2000 | Gunasekera | 702/6 |
| 6,106,561 A | 8/2000 | Farmer | 703/10 |
| 6,191,796 B1 | 2/2001 | Tarr | 345/581 |
| 6,313,837 B1 * | 11/2001 | Assa et al. | 345/420 |
| 6,445,390 B1 | 9/2002 | Aftosmis et al. | 345/421 |
| 6,448,788 B1 | 9/2002 | Meaney et al. | 324/637 |
| 6,516,080 B1 | 2/2003 | Nur | 382/109 |
| 6,552,724 B1 | 4/2003 | Marshall | 345/420 |
| 6,587,104 B1 | 7/2003 | Hoppe | 345/423 |
| 6,608,628 B1 | 8/2003 | Ross et al. | 345/619 |
| 6,674,432 B2 * | 1/2004 | Kennon et al. | 345/419 |
| 6,816,820 B1 | 11/2004 | Friedl et al. | 703/2 |
| 2002/0032494 A1 | 3/2002 | Kennon et al. | 700/98 |
| 2002/0032550 A1 | 3/2002 | Ward et al. | 703/2 |
| 2002/0035453 A1 | 3/2002 | Pond et al. | 703/2 |
| 2002/0046014 A1 | 4/2002 | Kennon | 703/9 |
| 2002/0067373 A1 | 6/2002 | Roe et al. | 715/762 |
| 2002/0072883 A1 | 6/2002 | Lim et al. | 703/2 |
| 2002/0082813 A1 | 6/2002 | Lim et al. | 703/2 |

OTHER PUBLICATIONS

Ding et al., Development of Dynamic Local Grid Refinement in Reservoir Simulation, Proceedings of the 12th SPE Symposium on Reservoir Simulation, New Orleans, LA, Feb.–Mar. 1993, pp. 501–510.*

Verna et al., Control Volume Scheme for Flexible Grids in Reservoir Simulation, Proceedings of the 1997 SPE Reservoir Simulation Symposium, Dallas, TX, Jun. 1997, pp. 215–227.*

Kocberber, An Automatic, Unstructured Contol Volume Gereration System for Geologically Complex Reservoirs, Proceedings of the 1997 SPE Reservoir Simulation Symposium, Dallas, TX, Jun. 1997, pp. 241–252.*

Kuwauchi et al., Development and Applications of a Three Dimensional Voronoi–Based Flexible Grid Black Oil Reservoir Simulator, SPE Asia Specific Oil & Gas Conference, Adelaide, Australia, Oct. 1996, pp. 1–12.*

Page et al., A Functional Program Describing a Simple Reservoir Model and Its Potential for Pallallel Computation, Proceedings of the 1990 Symposium on Applied Computing, IEEE, Apr. 1990, pp. 85–91.*

Giertsen, Volume Visualization of Sparse Irregular Meshes, Computer graphcs and Applications, IEEE, vol. 2, No. 2, Mar. 1992, pp. 40–48.*

Wheeler et al., "A Parallel Multiblock/Multidomain Approach for Reservoir Simulation", Proceedings of the 1999 15th Symposium on Reservoir Simulation, Houston, Texas, Feb. 14–17, 1999.

International Search Report dated Mar. 11, 2002.

S. Ghosh, "Curvilinear Local Grid Refinement", SPE 50633, SPE European Petroleum Conference, The Netherlands, Oct. 20–22, 1998.

H. N. Sharpe, et al., "A New Adaptive Orthogonal Grid Generation Procedure for Reservoir Simulation" 65th Annual Technical Conference and Exhibition of the Society of Petroleum Engineers, New Orelans, LA, Sep. 23–26, 1990.

M. Wheeler, et al., "A Parallel Multiblock/Multidomain Approach for Reservoir Simulation", Proceedings of the 1999 15th Symposium on Reservoir Simulation, Houston, Texas, Feb. 1999, XP–002188857.

D. Kahaner, et al., "An Expreimental Algorithm for N–Dimensional Adaptive Quadrature", ACM Transactions on Mathematical Software (TOMS), Mar. 1979, pp. 86–96.

Y. Ozdogan, "Seismic Data Processing", Society of Exploration Geophysics, Tulsa, OK, 1991, p. 514–515.

S. Norris, et al., "Modeling Fluid Flow Around Horizontal Wellbores", Proceedings: SPE Annual Technical Conference and Exhibition 1990 Part 4, New Orleans, LA Sep. 23–26, 1990, vol. SIGMA, pp. 65–75.

P. Perrochet, "Finite Hyperelements: A 4D Geometrical Framework Using Coariant Baes and Metric Tensors" Communications in Numberical Methods in Engineering, Jun. 1995. UK, vol. 11, No. 6, pp. 525–534.

J.M.M. Regtien, et al., "Interactive Reservoir Simulation", Proceedings of the 13th Symposium on Reservoir Simulation, San Antonio, Texas, Feb. 12–15, pp. 545–552.

C. Buckalew, et al., "Oilfield Visulization on the PC Platform", 2000 SPE/AAPG Western Regional Meeting, Jun. 19–23, 2000, pp. 1–5.

E. Farkas, Linearization Techniques of Reservoir Simulation Equations: Fully Implicit Cases, Proceedigns of the 1997 SPE Reservoir Simulation Symposium, Dallas, Texas, Jun. 8–11, 1997, pp. 87–95.

E. Farkas, Linearization Techniques of Reservoir Simulation Equations: Fully Implicit Cases, Richardson, Texas, Dec. 1998, vol. 3, No. 4. pp. 316–323.

P. Benedeck, Capacitances of Planar Multiconductor Configuration on a Dielectric Substrate by a Mixed Order Finite–Element Method, IEEE1974.

Fu, et al., Time Integration Procedures for a Cyclic Thermoviscoplasticity Model for Pb–Sn solder applications, IEEE 1996.

P. J. Zwart, et al., "Space–Time Meshing for Two–Dimensional Moving Boundary Problems", Proceedings of the Seventh International Meshing Roundtable, pp. 187–199, 1998.

S. L. Ho, et al., "Generation and Rotation of 3–D Finite Element Mesh for Skewed Rotor Induction Motors Using Extrusion Technique", IEEE Transactions on Magnetics, pp. 1266–1269, May 1999.

* cited by examiner

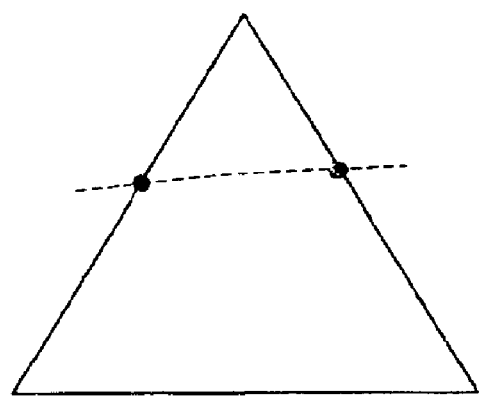
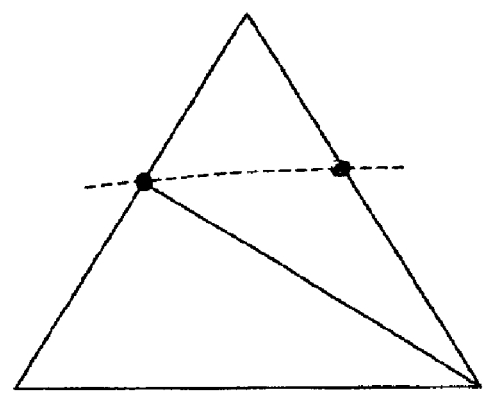
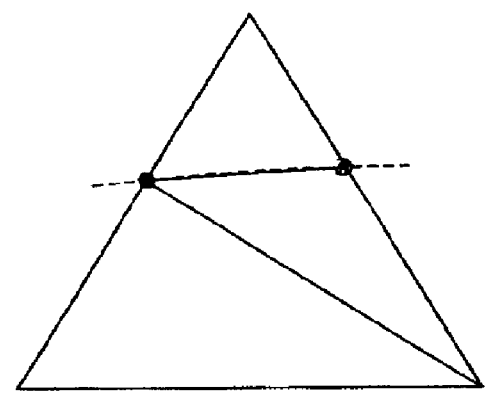
Fig. 8

FEATURE MODELING IN A FINITE ELEMENT MODEL

RELATED APPLICATIONS

This application claims priority under 35 U.S.C. §119(e) to U.S. patent application Ser. No. 60/215,697 entitled "Method and System for Oil Reservoir Simulation and Modeling" by Stephen R. Kennon, Kok Thye Lim, Scott A. Canaan, Steven B. Ward, Stuart W. Pond, Jr. and Edward J. Barragy, filed Jun. 29, 2000, which is incorporated by reference as if set forth in its entirety herein.

TECHNICAL FIELD OF THE INVENTION

This invention relates generally to methods for modeling physical systems using finite element analysis and, more specifically, to methods for modeling features of the physical systems, such as fractures in a geological structure, for which one or more properties change at the boundaries between these features and the surrounding regions of the physical system.

BACKGROUND OF THE INVENTION

Physical systems can be modeled mathematically to simulate their behavior under certain conditions. There are a wide variety of means to model these systems, ranging from the very simplistic to the extremely complicated. One of the more complicated means to model physical systems is through the use of finite element analysis. As the name implies, finite element analysis involves the representation of individual, finite elements of the physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization or mesh generation. The region is represented by functions defined over each element. This generates a number of local functions that are much simpler than those which would be required to represent the entire region. The next step is to analyze the response for each element. This is accomplished by building a matrix that defines the properties of the various elements within the region and a vector that defines the forces acting on each element in the structure. Once all the element matrices and vectors have been created, they are combined into a structure matrix equation. This equation relates nodal responses for the entire structure to nodal forces. After applying boundary conditions, the structure matrix equation can be solved to obtain unknown nodal responses. Intra-element responses can be interpolated from nodal values using the functions which were defined over each element.

Finite element models are often used to determine the behavior of geological structures such as oil reservoirs under certain conditions. Finite element models can simulate the flow of oil through particular regions of the reservoir in response to the various oil recovery operations, such as drilling. The resulting information is useful in the analysis of the reservoir and the management of the oil recovery operations.

Conventional finite element models, however, have certain limitations which prevent them from accurately simulating the behavior of the physical systems which the model. For example, in the case of the oil reservoir, the finite element model may represent a particular property of the reservoir using a mathematical function which gradually changes according to the position within the reservoir. It may be very difficult to force these functions to approximate changes in the properties which occur very abruptly as a result of geological features within the reservoir. For instance, a reservoir may have two distinct layers, each of which has a substantially different value for a given property (e.g., porosity.) at the boundary between these two layers, a mathematical function representing the value of the property might therefore have to make an immediate transition from one value to the other at the boundary between the layers. Even if the mathematical function can be adapted to represent the respective values for the property at the boundary between the two layers, such a function would typically be very complex and would require a great deal of computational resources.

It would therefore be desirable to provide a method for more accurately representing the values of certain properties within a finite element model, particularly across the boundaries of features within the model for which the properties change rapidly or are discontinuous, while at the same time requiring a relatively small amount of computational resources.

SUMMARY OF THE INVENTION

One or more of the problems outlined above may be solved by the various embodiments of the present invention. Broadly speaking, the invention comprises a method for simulating a physical system using a finite element model which comprises at least two distinct models corresponding to distinct regions within the modeled system.

In one embodiment of the invention, a method comprises defining a finite element model corresponding to an oil reservoir. A second finite element model corresponding to a feature found within the reservoir is also defined. The boundaries of the feature model are used to carve out a portion of the reservoir model. The feature model is then inserted into the carved out portion of the reservoir model. Although they represent portions of the same oil reservoir, the properties corresponding to the two finite element models can be defined independently. In some cases, there will be nodes which are common to both models and must therefore take on different values for certain properties, depending upon whether the values are used in the solution of the reservoir model or the feature model. An evaluator is therefore associated with each of the models. The evaluator determines whether the value of a property is governed by the definition of the reservoir model or that of the feature model. When one of the models is solved, the corresponding evaluator is used so that the nodes which are common to both models are evaluated according to the definition of that particular model.

In one embodiment of the invention, a reservoir or other system which has features that are relatively constant in one dimension (e.g., vertically) is modeled in three dimensions by creating a two-dimensional finite element model for each of the different features of the system and extruding this model in the third dimension. The two-dimensional model may be defined by generating a first model and then carving out a portion of this model to accommodate a second model. The second model corresponds to a feature within the system of the first model. The first model is adapted to the boundaries of the carve-out so that each of the two models extends to the boundary between them. A plurality of nodes are common to both of the models. These common nodes may have two different values for a given property, each of which is associated with one of the models. The elements of the combined models are then extruded and subdivided into three-dimensional simplex elements. An evaluator is associated with each of the resulting three-dimensional finite element models. When a solution for each of these models is generated, the corresponding evaluator controls the value which is associated with each of the common nodes (so that the values associated with the corresponding model are used).

In another embodiment, a software application is configured to implement the methods described above. The software application comprises instructions which are configured to cause a computer to perform the described methods. These instructions may be stored on any type of computer readable medium. These media may include, without limitation, CD-ROMs, floppy disks, magnetic tapes, solid-state memories and the like.

BRIEF DESCRIPTION OF THE DRAWINGS

Other objects and advantages of the invention may become apparent upon reading the following detailed description and upon reference to the accompanying drawings in which:

FIG. 8 is a diagram illustrating the manner in which a two-dimensional simplex is adapted to form new simplices which lie on either side of an intersecting boundary.

Figure 1:
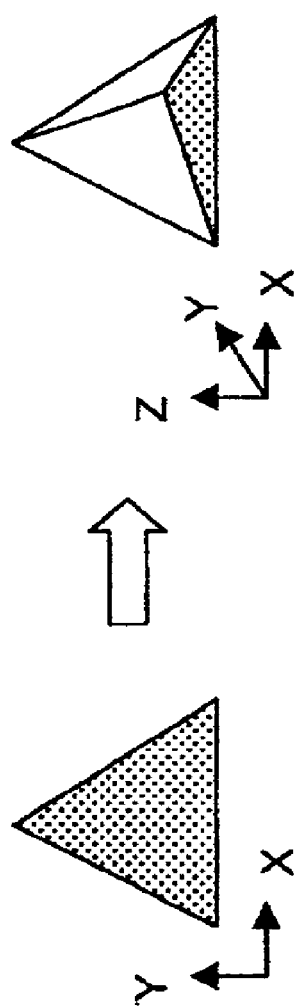
FIG. 1 is a diagram illustrating the simplices in two and three dimensions.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF A PREFERRED EMBODIMENT

A preferred embodiment of the invention is described below. It should be noted that this and any other embodiments described below are exemplary and are intended to be illustrative of the invention rather than limiting.

Generally speaking, the present invention comprises a method for simulating systems using a finite element modeling, as well as computer applications which embody the method and computers which are configured to perform the method. The method involves the definition of multiple, distinct finite element models which represent corresponding regions within the modeled system. Each of these finite only models comprises a set of nodes at which values are defined for various properties. For nodes which lie on boundaries between models, there are a plurality of values corresponding to a given property, wherein each of the values corresponds to a different one of the models. Each of the models is solved separately, using the values for each property which correspond to that model.

As indicated above, the present invention may be useful in the simulation of oil reservoirs which have features that cause certain properties to vary rapidly as a function of position within the reservoir. These features may include distinct geological strata, fractures, completion zones, damage zones, or any other feature which may cause strong heterogeneities within the reservoir. It should be noted that, while the embodiments of the invention described herein are primarily directed to the modeling of geological structures such as oil reservoirs, they may also be applied to the modeling of other systems.

The details of a preferred embodiment will be set forth below. It may be helpful, however, to first define a few terms.

A node is a point in space. In finite element modeling, nodes form the vertices of the elements which are modeled. The nodes also form part of a mesh of nodes and edges which define the boundaries between elements in the modeled space.

An edge is a line between two nodes which form vertices of an element. The edges form part of the mesh which defines the boundaries between elements in the modeled space.

A simplex is a spatial configuration of n dimensions determined by n+1 points in a space of dimension equal to or greater than n. In other words, a-simplex is a geometric spatial element having the minimum number of boundary points necessary to enclose a space in a given number of dimensions. For example, in two dimensions, a simplex comprises a triangle, together with the interior area bounded by the triangle (see FIG. 1.) Two points are insufficient to form a simplex in two-dimensional space because no area is bounded by the points (and the lines which interconnect them.) While four points may be sufficient to bound a two-dimensional area, they do not comprise the minimum number of boundary points by which the two-dimensional area can be bounded. In three dimensions, a simplex comprises a tetrahedron, which is bounded by four vertices (see FIG. 1.) In four dimensions, a simplex comprises a hyper-tetrahedron (sometimes referred to as a hypertet) having five vertices.

A mesh is a collection of elements that fill a space. These elements are representative of a system which resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

Figure 2:
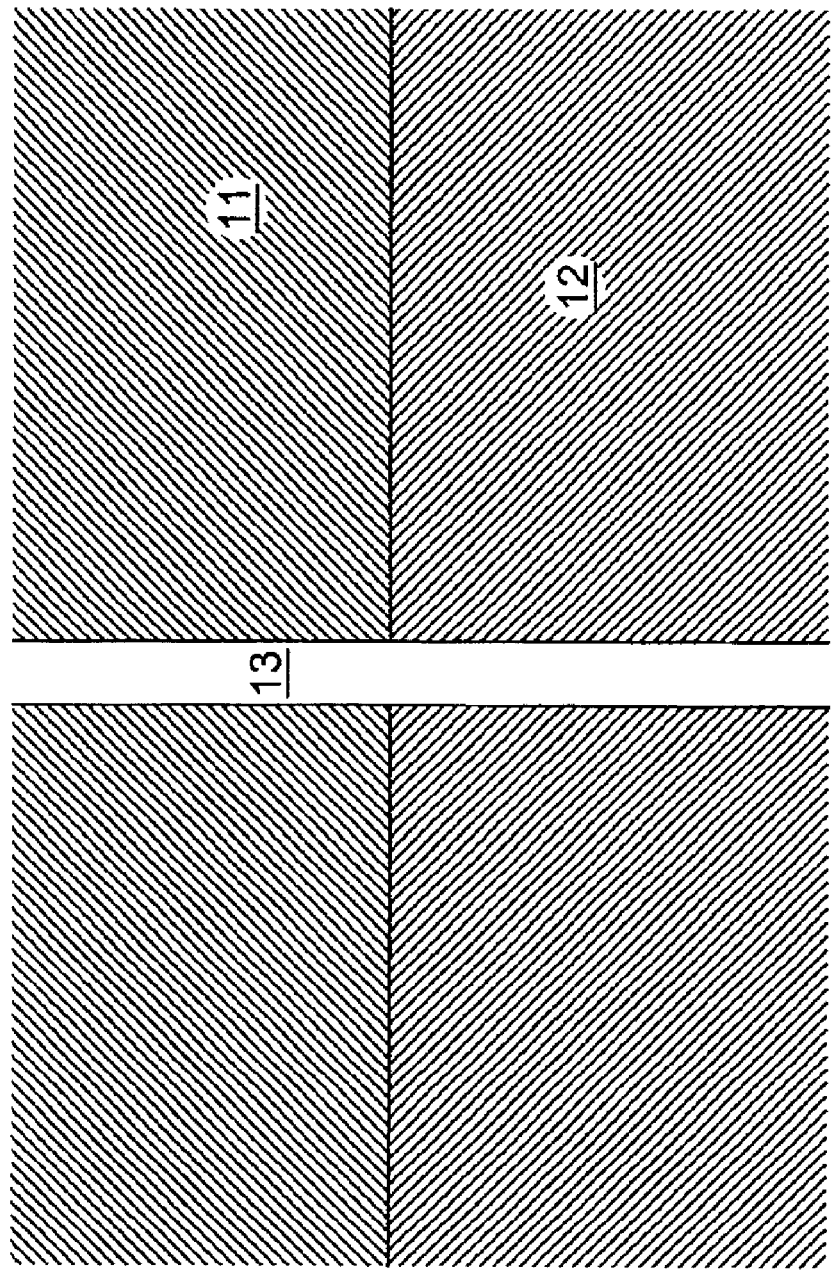
FIG. 2 is a diagram illustrating the boundaries between several features within a reservoir.

Referring to FIG. 2, a diagram illustrating the boundaries between several features within a reservoir are shown. The figure is a sectional view of an oil reservoir which is being modeled. FIG. 2 depicts a first layer 11 which comprises a first material (e.g., shale) which has a corresponding set of properties. A second layer 12 is also shown. Layer 12 comprises a second material (e.g., chalk) which has a corresponding set of properties. Generally speaking, the same properties (e.g., permeability or porosity) will be identified for both layers for the purposes of modeling the reservoir. The values for these properties in each of the layers, however, may differ substantially. For example, the permeability of one layer might be high while the permeability of the other is low. FIG. 2 also depicts a fracture 13 which extends through both layer 11 and layer 12. The fracture can also be characterized by corresponding values for each of the identified properties. For instance, although it is not normally used as an identifying characteristic of a fracture (i.e., empty space,) a permeability value (which will obviously be very high) can be assigned to the fracture.

When a finite element model for the reservoir depicted in FIG. 2 is constructed, it may comprise three sub-models: one corresponding to layer 11; one corresponding to layer 12; and one corresponding to fracture 13. Each sub-model will include nodes which lie on the boundaries between it and the other sub-models. Generally speaking, each node which is on one of these boundaries will be common to all of the sub-models which share that boundary (although this is not always the case.) Because nodes which are common to more than one sub-model will need to have different values for particular properties, depending upon the sub-model which is being evaluated, a mechanism must be provided to ensure that the proper values are used.

In a preferred embodiment, an evaluator is associated with each of the sub-models. The evaluator controls the values of the parameters for each of the nodes on the boundaries between models. In this way, it defines parameters for each node according to the sub-model which is being solved. As a solution for a particular sub-model is computed, the evaluator corresponding to the sub-model is applied to the common nodes so that the parameters corresponding to that sub-model are used for the common nodes. Thus, a single node which lies on a boundary between two sub-models is seen as having a first set of parameters from a first one of the sub-models, but is seen as having a second set of parameters from a second one of the sub-models.

In the present method, sub-models can be created for selected structures within a reservoir (e.g., geological strata, fractures, etc.) Using these sub-models, unique values or functions can be employed to simulate property variations within each structure. Because the sub-models are distinct, boundaries between elements with sharply contrasting properties can be accurately represented.

Figure 3:
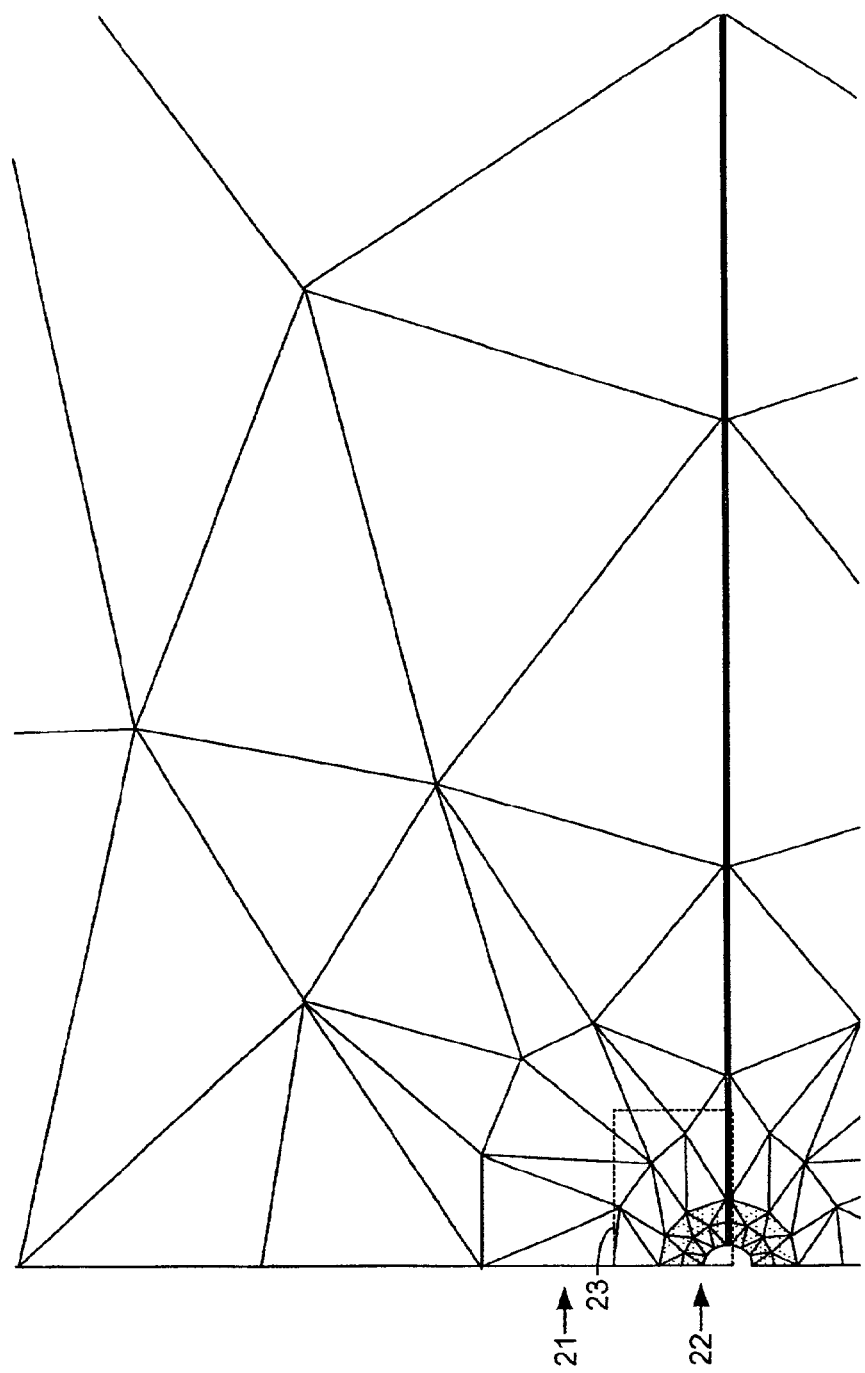
FIG. 3 is a diagram illustrating a two-dimensional finite element mesh corresponding to a portion of an oil reservoir.
Figure 4:
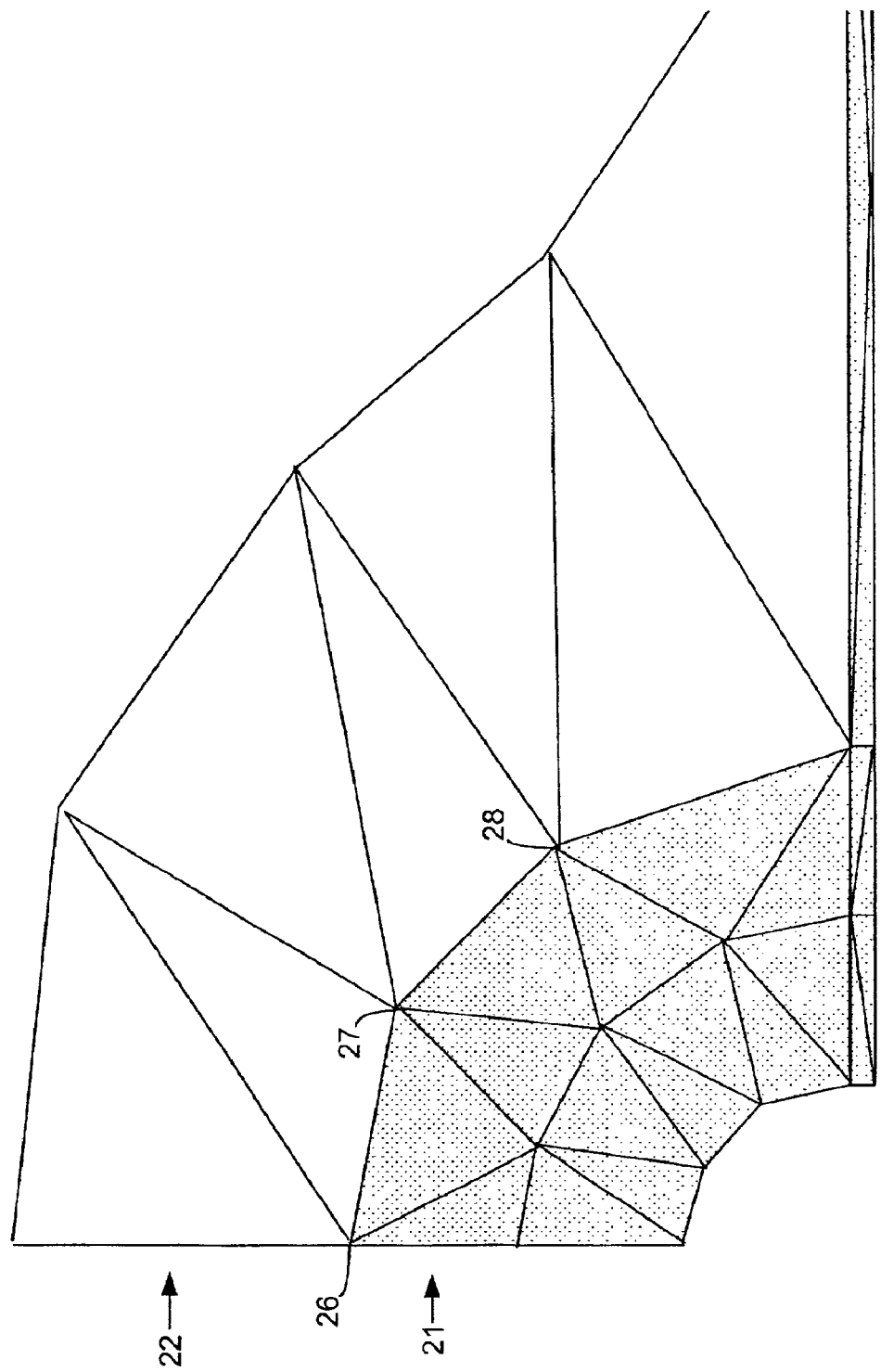
FIG. 4 is a an expanded view of the two-dimensional finite element mesh illustrated in FIG. 3.

Referring to FIGS. 3 and 4, a two-dimensional finite element mesh corresponding to a portion of an oil reservoir is shown to illustrate the use of distinctive sub-models to represent different regions within the reservoir. FIG. 3 is a larger view of the mesh, while FIG. 4 is a close-up view of the same mesh. The extent of the mesh shown in FIG. 4 is indicated by dotted line 23 in FIG. 3.

The mesh shown in FIG. 3 comprises two sub-models representing distinct features within the reservoir. The first model 21 corresponds to a partial completion area and a fracture. The second model corresponds to a separate, relatively homogeneous structure which adjoins the completion area and fracture. ("Homogeneous" is used here to refer to properties which change relatively slowly, rather than simply being constant.) Model 21 is stippled to more clearly delineate its extent.

The elements of the mesh in FIGS. 3 and 4 are bounded by the lines which represent the edges of the elements. Each of the edges extends between two corresponding nodes of the mesh. The two-dimensional mesh can be extruded into a third dimension to form a three-dimensional finite element mesh, as will be explained in more detail below.

Because the elements of model 22 represent a relatively homogeneous region, they can be stimulated with relative ease by a corresponding property value (or mathematical function.) The elements of model 21 are also sufficiently homogeneous within the model that the properties of the nodes in the model can be modeled by assigned values or mathematical functions. Because they are modeled by separate values and/or functions, the properties of adjacent elements in the two models (one from each model) can have sharp changes or discontinuities at the boundary between the elements.

Referring to FIG. 4, it can be easily seen that some of the nodes which define elements of model 21 are also used to define elements of model 22. For example, nodes 26, 27 and 28 lie on the boundary between the two models and are used to define elements of each of the models. Consequently, these nodes may have to take on different values for a given property, depending upon whether they are being evaluated with respect to one model or the other. This is achieved in the preferred embodiment by associating a unique evaluator with each of the models. When a solution is generated for a particular model, the evaluator associated with that model is used to determine the appropriate value for each of the boundary nodes.

It should be noted that there may be nodes which lie on the boundary between two models, but which are not common to both models. Because these nodes define elements in only one of the models, they have only one value/function for each property, so there is no need to identify the model for which the node is being used to compute a solution.

Figure 5:
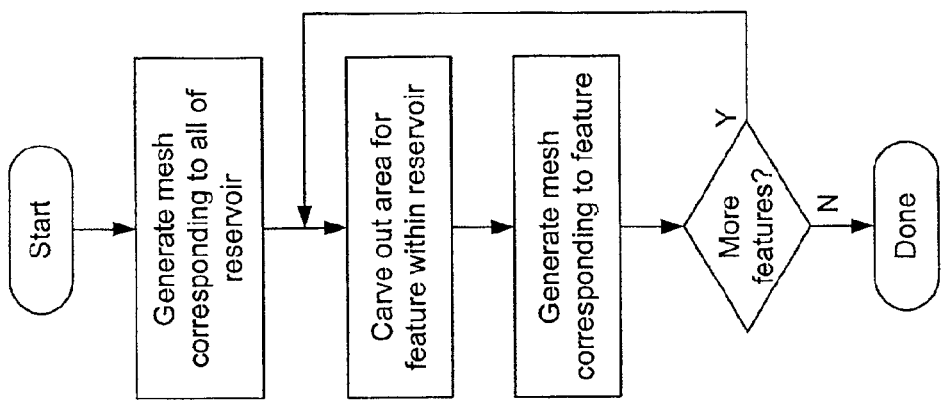
FIG. 5 is a flow diagram illustrating a method according to one embodiment of the invention.

Referring to FIG. 5, a flow diagram illustrating a method according to one embodiment of the invention is shown. While this figure will be described with reference to an oil reservoir as the modeled system, the same methodology can be applied to other systems as well. In this method, an initial finite element mesh corresponding to the overall reservoir is generated and then separate finite element meshes corresponding to features within the reservoir are inserted into the first mesh. This first mesh is adapted to accommodate the new, secondary meshes. In other words, the regions occupied by the secondary meshes are carved out of the first mesh so that no two meshes occupy the same space.

The initial finite element mesh, as adapted to accommodate the other meshes, will serve as a model for one of the regions of the reservoir. (Although this region may be smaller than the other regions in some cases, it will typically represent the bulk of the reservoir.) This mesh can be generated by any suitable means known to persons of skill in the art of finite element modeling. An unstructured mesh of simplex elements is preferred. After the first mesh is generated, a feature is defined and then a secondary region is carved out of the first mesh to accommodate the secondary region. A mesh is generated within the boundaries defined for the feature. The mesh may be constructed before the secondary region is carved out of the first mesh, or it may be generated afterwards. In either case, two separate finite element models corresponding to the different regions of the modeled system are created. These models are immediately adjacent to each other (i.e., there is a common boundary between them.) This process may be repeated for additional features in the modeled system (and additional secondary regions within the first finite element mesh).

In the preferred embodiment, this process is actually carried out in two dimensions to generate a mesh which is then extruded into three dimensions. For example, if it is assumed that the completion zone and fracture represented by model 21 in FIG. 4 represent features in a horizontal plane, the two-dimensional mesh shown in the figure can be extruded vertically to generate a three-dimensional mesh. This is illustrated in FIG. 6.

Figure 6:
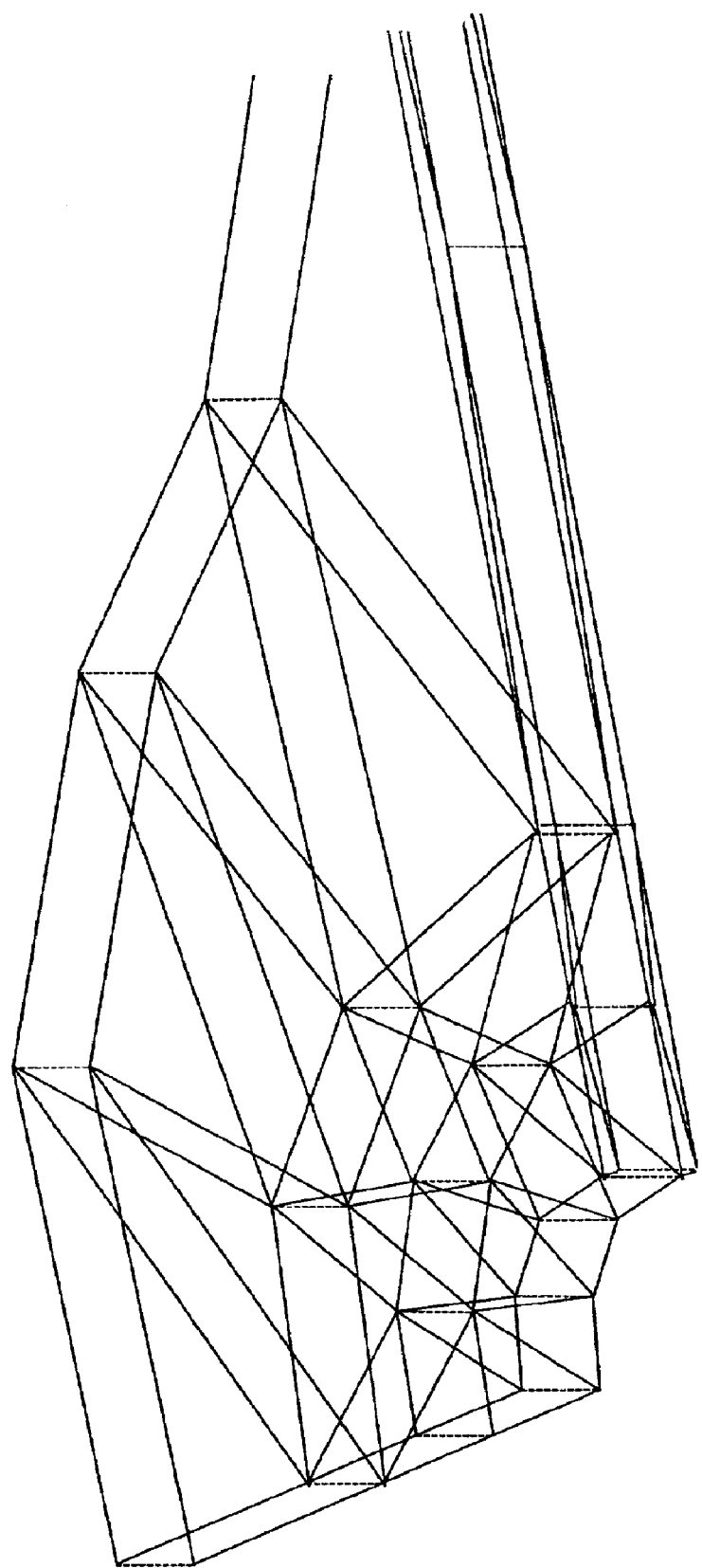
FIG. 6 is a diagram illustrating a three-dimensional finite element mesh generated by extruding the two-dimensional mesh of FIG. 4.

FIG. 6 shows the two-dimensional mesh of FIG. 4 from an oblique angle. This two-dimensional mesh is extruded vertically (as indicated by the dotted lines) to form a plurality of three-dimensional prisms. In a preferred embodiment, these prisms are subdivided into three-dimensional simplices (tetrahedra.) The generation of a three-dimensional mesh in this manner may reduce the computational requirements of mesh generation by confining the adaptation process (the dividing of the initial mesh into two separate meshes) to two dimensions and then extruding the refined two-dimensional mesh. This eliminates what is effectively the separate refinement of the same two-dimensional mesh several times at different points in the third dimension.

Figure 7:
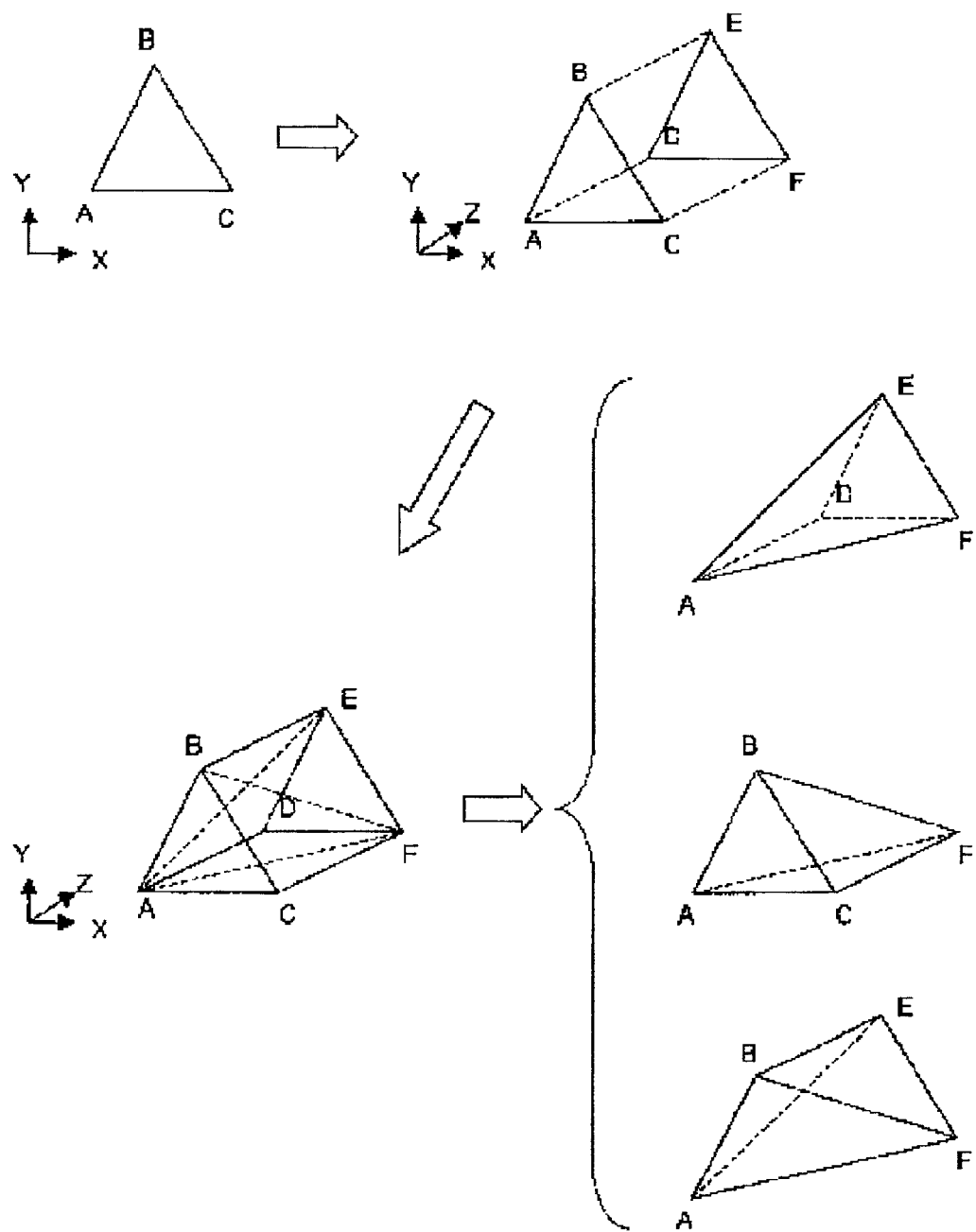
FIG. 7 is a diagram illustrating the manner in which a two-dimensional mesh is extruded to form a three-dimensional mesh.

While the extrusion process will not be described in detail in this disclosure, FIG. 7 is presented herein to illustrate the manner in which the extrusion from two dimensions to three dimensions is accomplished. FIG. 7 shows a single, two-dimensional simplex (a triangle) which is extruded to form a three-dimensional prism. This prism is then subdivided into three three-dimensional simplices (tetrahedra). It should be noted that this same procedure can be used to extrude a three-dimensional mesh in a fourth dimension (e.g., time.)

In one embodiment, the boundaries of the different regions are determined before any of the meshes are generated. When the different regions are defined, a mesh is constructed within each region. Each mesh is constructed so that it extends to the boundaries which are shared by the meshes (as well as the outer extent of the entire modeled system.) The generation of the mesh may be performed in any suitable manner. Any desired number of regions can be defined and corresponding meshes can be generated within these regions.

In another embodiment, the first mesh is generated so that it fills the entire space of the modeled system. A boundary is then defined to separate the regions of the system. Since this boundary may cut existing elements into two pieces, the mesh in each region is adapted to form valid simplices in place of the intersected elements. This results in two meshes corresponding to the two regions of the system.

Although the adaptation process will not be described in great detail, FIG. 8 is presented to provide an illustration of the process. FIG. 8 comprises three views of a two-dimensional simplex (a triangle) which is adapted to form simplices on each side of a boundary. In the first figure, the simplex is shown intersected by a boundary curve. The edges of the simplex are intersected at two points. A new node is created at each of the intersections. A new edge is then defined between one of the new nodes and the opposite vertex of the simplex, forming two new simplices. A new edge is then defined between the remaining new node and the opposite vertex of the new simplex. This procedure results in three new simplices—one above the boundary, and two below it.

Essentially the same procedure can be performed in the case of three-dimensional simplices. The resulting simplices will lie essentially on one side or the other of the boundary. (Because the boundary may be curved, the simplices, which have flat surfaces, may not lie exactly on the boundary.) Since the adaptation process produces simplices which are almost entirely on one side of the boundary, they can each be defined as part of the first region or the second region, hence part of the first finite element model or the second.

It should be noted that the preceding paragraphs describing the creation of finite element models corresponding to different regions of the modeled system are applicable to n-dimensional meshes.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While the present invention has been described with reference to particular embodiments, it should be understood that the embodiments are illustrative and that the scope of the invention is not limited to these embodiments. Many variations, modifications, additions and improvements to the embodiments described above are possible. Particularly, these variations may include computers or other data processing devices, computer readable media (such as floppy disks, CD-ROMs, DVD-ROMs, etc.,) storage devices, computer memories and the like which contain software, firmware or other programming embodying the foregoing methods. It is contemplated that these variations, modifications, additions and improvements fall within the scope of the invention as detailed within the following claims.

What is claimed is:

1. A computer-implemented method for modeling a reservoir system comprising:

determining a property value of a physical property of at least one feature of a plurality of features of the reservoir system;

defining a plurality of finite element meshes, each finite element mesh associated with one feature of the plurality of features of the reservoir system, wherein a plurality of nodes are common to at least two finite element meshes of the plurality of finite element meshes;

defining a property representation associated with each finite element mesh of the plurality of finite element meshes, the property representation based on the property value of the physical property associated with the each finite element mesh, wherein for each finite element mesh of the plurality of finite element meshes, the property representation is defined by a corresponding function which is independent of other functions associated with the physical property and associated with other finite element meshes;

associating an evaluator with each finite element mesh of the plurality of finite element meshes; and generating a representation of the reservoir system based each finite element mesh of the plurality of finite element meshes, wherein for each finite element mesh of the plurality of finite element meshes, the function used to define the property representation at each of the common nodes is selected according to the evaluator associated with the each finite element mesh.

2. The method of claim 1 wherein defining the plurality of finite element meshes comprises defining nodes on a boundary between the at least two finite element meshes to be common to the at least two finite element meshes which touch the corresponding boundary.

3. The method of claim 2 wherein at least one node which lies on the boundary between the at least two finite element meshes is not common to the at least two finite element meshes which touch the corresponding boundary.

4. The method of claim 1 wherein the the physical property is permeability or porosity.

5. The method of claim 4 wherein at least two of the functions associated with the physical property are not continuous with each other.

6. The method of claim 1 wherein the reservoir system is an oil reservoir, wherein one finite element mesh of the plurality of finite element meshes corresponds to a first portion of the oil reservoir and another of the finite element meshes corresponds to a feature selected from the group consisting of a fracture; a completion zone; a damage zone; a geological stratum; and a near well region.

7. The method of claim 1 wherein defining the plurality of finite element meshes comprises defining a plurality of two-dimensional finite element meshes and extruding the two-dimensional finite element meshes in a third dimension to obtain three-dimensional finite element meshes.

8. The method of claim 1 wherein defining the plurality of finite element meshes comprises defining a first finite element mesh to include both a first region and a second region corresponding to the reservoir system, refining the first finite element mesh to carve out the second region, and defining a second finite element mesh within the second region.

9. The method of claim 8 wherein refining the first finite element mesh to carve out the second region comprises defining a boundary surface between the first region and the second region, adapting the first finite element mesh to define elements having surfaces which lie substantially on the boundary surface, defining the first finite element mesh as the elements on a first side of the boundary surface and defining the second finite element mesh as the elements on a second side of the boundary surface.

10. The method of claim 9 wherein adapting the first finite element mesh comprises identifying intersections of edges of the elements of the first finite element mesh with the boundary surface, defining nodes at the identified intersections, and refining the elements of the first finite element mesh to incorporate the newly defined nodes.

11. A computer-implemented method for representing a reservoir, wherein the reservoir has a plurality of adjoining regions corresponding to the reservoir and one or more features within the reservoir, wherein each of the regions is characterized in a corresponding finite element model, and wherein for a selected physical property of the reservoir each finite element model employs an independent function to represent the selected physical property, the method comprising:

determining a property value of the selected physical property for each region of the plurality of regions;

associating an evaluator with each finite element model; and generating a solution for each finite element model; wherein generating the solution comprises calculating a solution based on the value of the independent function representing the selected physical property at each of the nodes in the each finite element model, wherein for each of one or more nodes which lie on boundaries between the each finite element model being solved and one or more other finite element models, the value is dependent upon the evaluator associated with the each finite element model being solved.

12. A computer readable medium containing instructions which are configured to cause a computer to perform the method comprising: defining a plurality of finite element meshes, wherein a plurality of nodes are common to at least two of the finite element meshes; defining a property associated with each of the finite element meshes, wherein for each of the finite element meshes, the property is defined by a corresponding function which is independent of the other functions; associating an evaluator with each of the finite element meshes; and generating a solution for each of the finite element meshes, wherein for each of the finite element meshes, the function used to define the value of the property at each of the common nodes is selected according to the evaluator associated with the finite element mesh.

13. The computer readable medium of claim 12 wherein defining the plurality of element meshes comprises defining all nodes on boundaries between the finite element meshes to be common to the finite element meshes which touch the corresponding boundaries.

14. The computer readable medium of claim 12 wherein at least one node which lies on one of the boundaries between the finite element meshes is not common to all of the finite element meshes which touch the corresponding boundary.

15. The computer readable medium of claim 12 wherein the each function is distinct from the other functions.

16. The computer readable medium of claim 15 wherein at least two of the functions are not continuous with each other.

17. The computer readable medium of claim 12 wherein one of the finite element meshes corresponds to a first portion of an oil reservoir and another of the finite element meshes corresponds to a feature within the oil reservoir, and wherein the feature is selected from the group consisting of: a fracture; a completion zone; a damage zone; a geological stratum; and a near well region.

18. The computer readable medium of claim 12 wherein defining the plurality of finite element meshes comprises defining a plurality of two-dimensional finite element meshes and extruding the two-dimensional finite element meshes in a third dimension to obtain three-dimensional finite element meshes.

19. The computer readable medium of claim 12 wherein defining the plurality of finite element meshes comprises defining a first finite element mesh to include both a first region and a second region corresponding to the modeled system, refining the first finite element mesh to carve out the second region, and defining a second finite element mesh within the second region.

20. The computer readable medium of claim 12 wherein refining the first finite element mesh to carve out the second region comprises defining a boundary surface between the first region and the second region, adapting the first finite element mesh to define elements having surfaces which lie substantially on the boundary surface, defining the first finite element mesh as the elements on a first side of the boundary surface and defining the second finite element mesh as the elements on a second side of the boundary surface.

* * * * *

UNITED STATES PATENT AND TRADEMARK OFFICE
CERTIFICATE OF CORRECTION

PATENT NO. : 6,941,255 B2
DATED : September 6, 2005
INVENTOR(S) : Stephen R. Kennon and Steven B. Ward It is certified that error appears in the above-identified patent and that said Letters Patent is hereby corrected as shown below:

Column 8,
Lines 59-61, please add the word -- on -- after the word "based" and before the word "each".

Signed and Sealed this

Twenty-ninth Day of November, 2005

JON W. DUDAS
*Director of the United States Patent and Trademark Office*